US010771902B1

(12) United States Patent
Ryu et al.

(10) Patent No.: US 10,771,902 B1
(45) Date of Patent: Sep. 8, 2020

(54) DISPLAY APPARATUS AND COMPUTING APPARATUS INCLUDING THE SAME

(71) Applicant: LG Display Co., Ltd., Seoul (KR)

(72) Inventors: Kyungyeol Ryu, Paju-si (KR); Chiwan Kim, Paju-si (KR); YuSeon Kho, Paju-si (KR); YongGyoon Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/447,353

(22) Filed: Jun. 20, 2019

(30) Foreign Application Priority Data

Mar. 29, 2019 (KR) ........................ 10-2019-0037506

(51) Int. Cl.
| | |
|---|---|
| *H04R 17/00* | (2006.01) |
| *H04R 7/02* | (2006.01) |
| *H01L 41/047* | (2006.01) |
| *H01L 41/08* | (2006.01) |
| *H01L 41/09* | (2006.01) |
| *H01L 41/37* | (2013.01) |
| *B06B 1/06* | (2006.01) |
| *H01L 41/083* | (2006.01) |

(52) U.S. Cl.
CPC ............ *H04R 17/005* (2013.01); *B06B 1/06* (2013.01); *H01L 41/047* (2013.01); *H01L 41/082* (2013.01); *H01L 41/083* (2013.01); *H01L 41/0986* (2013.01); *H01L 41/37* (2013.01); *H04R 7/02* (2013.01); *H04R 2201/003* (2013.01); *H04R 2217/03* (2013.01); *H04R 2499/15* (2013.01)

(58) Field of Classification Search
CPC ....... B06B 1/06; H01L 41/047; H01L 41/082; H01L 41/083; H01L 41/0986; H01L 41/37; H04R 7/02; H04R 17/005; H04R 2201/003; H04R 2217/03; H04R 2499/15
See application file for complete search history.

(56) References Cited

U.S. PATENT DOCUMENTS

| | | | |
|---|---|---|---|
| 6,629,341 B2 | 10/2003 | Wilkie et al. | |
| 7,197,798 B2 | 4/2007 | Wilkie et al. | |
| 7,912,227 B2 | 3/2011 | Kim et al. | |
| 8,712,079 B2 | 4/2014 | Kim et al. | |
| 8,873,776 B2 | 10/2014 | Kim et al. | |
| 9,820,055 B2 * | 11/2017 | Babayoff | ............ H04R 17/005 |
| 2003/0056351 A1 | 3/2003 | Wilkie et al. | |

(Continued)

FOREIGN PATENT DOCUMENTS

| | | |
|---|---|---|
| KR | 2000-0001172 A | 1/2000 |
| KR | 10-2006-0070241 A | 6/2006 |

(Continued)

*Primary Examiner* — Brian Ensey
(74) *Attorney, Agent, or Firm* — Morgan, Lewis, Bockius LLP

(57) ABSTRACT

A display apparatus includes a display module having a display panel configured to display an image, a sound generation module disposed at the display module and configured to vibrate the display module to generate sound, a first cover configured to cover a first periphery portion of the display module, and a plurality of ultrasonic generation modules disposed between the first periphery portion of the display module and the first cover. The first cover includes a plurality of first holes overlapping with the plurality of ultrasonic generation modules.

24 Claims, 8 Drawing Sheets

(56) References Cited

U.S. PATENT DOCUMENTS

2012/0148073 A1    6/2012   Kim et al.
2020/0057475 A1*   2/2020   Ahn ..................... G06F 3/0412

FOREIGN PATENT DOCUMENTS

| KR | 10-2010-0073075 A | 7/2010 |
|----|-------------------|--------|
| KR | 10-2016-0015348 A | 2/2016 |
| KR | 10-1684141 B1 | 12/2016 |

* cited by examiner

DISPLAY APPARATUS AND COMPUTING APPARATUS INCLUDING THE SAME

CROSS-REFERENCE TO RELATED APPLICATIONS

This application claims the benefit of the Korean Patent Application No. 10-2019-0037506 filed on Mar. 29, 2019, the entirety of which is hereby incorporated by reference.

BACKGROUND

Technical Field

The present disclosure relates to a display apparatus and a computing apparatus using the same, and more particularly, to a display apparatus that is capable of outputting a sound toward a user located in front of a display panel and a computing apparatus including the same.

Discussion of the Related Art

In general, display apparatuses can be equipped in home appliances or electronic devices, such as televisions (TVs), monitors, notebook computers, smartphones, tablet computers, electronic organizers, electronic pads, wearable devices, watch phones, portable information devices, navigation devices, and automotive control display apparatuses, and are used as a screen for displaying an image.

General display apparatuses include a display panel for displaying an image and a sound device for outputting a sound associated with the image. However, in the general display apparatus, a sound output from a sound device travels to a rearwards region or a downwards region with respect to the display panel, and sound quality is degraded due to interference between sounds reflected from a wall or the ground. Due to this, it may be difficult to transfer an accurate sound, and immersion of a viewer is reduced.

In addition, sound devices of a portable computing apparatus, such as a notebook computer, are often disposed on a lower side of a keyboard and a bottom, a left side surface, and a right side surface of a system body, and are spaced apart from a screen. As such, a viewer's immersion experience is reduced due to a sense of difference (or mismatch) caused by a distance difference between a displayed image and a sound. Also, because an output direction of a sound may not be toward a direction of the ears of a viewer, a sound having a middle-high-pitched sound band with strong directivity may not be directly transferred to a viewer, and may be lost or distorted.

SUMMARY

Accordingly, the present disclosure is directed to a display apparatus and computing apparatus including the same that substantially obviate one or more of the problems due to limitations and disadvantages of the related art.

The inventors of the present disclosure have recognized problems with the general display apparatus and have performed various experiments on a scheme for outputting a sound toward a user (e.g., a viewer) located in front of the display panel. The inventors have developed a display apparatus having a new structure that is capable of outputting a sound toward a user located in front of the display panel, and a computing apparatus including the same.

An aspect of the present disclosure is to provide a display apparatus that is capable of outputting a sound to a user located in front of a display panel, and a computing apparatus including the same.

Another aspect of the present disclosure is to provide a display apparatus that is capable of outputting a sound (directivity sound) in a specific direction to a user located in front of a display panel, and a computing apparatus including the same.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus comprises a display module having a display panel configured to display an image; a sound generation module disposed at the display module and configured to vibrate the display module to generate sound; a first cover configured to cover a first periphery portion of the display module; and a plurality of ultrasonic generation modules disposed between the first periphery portion of the display module and the first cover, wherein the first cover includes a plurality of first holes overlapping with the plurality of ultrasonic generation modules.

In another aspect of the present disclosure, a display apparatus includes a display panel configured to display an image; a sound generation module configured to directly vibrate the display panel to generate sound; a front case configured to cover a first periphery portion of the display panel; a plurality of ultrasonic generation modules disposed at the front case; and a first cover covering the plurality of ultrasonic generation modules and including a plurality of holes overlapping with the plurality of ultrasonic generation modules, wherein the plurality of holes obliquely penetrates the first cover.

According to the present disclosure, a sound may be output to the front of the display panel, whereby a viewer's immersion experience may be enhanced due to harmony (or matching) between an image and the sound.

According to the present disclosure, the sound may be concentrated only on a user located in front of the display panel using longitudinal wave type ultrasonic waves, whereby a user privacy protection function may be realized.

According to the present disclosure, contaminants may be removed (or cleansed) from the surface of the display panel by using plate wave type ultrasonic waves generated on the display panel due to the longitudinal wave type ultrasonic waves, whereby a self-cleaning function may be realized.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
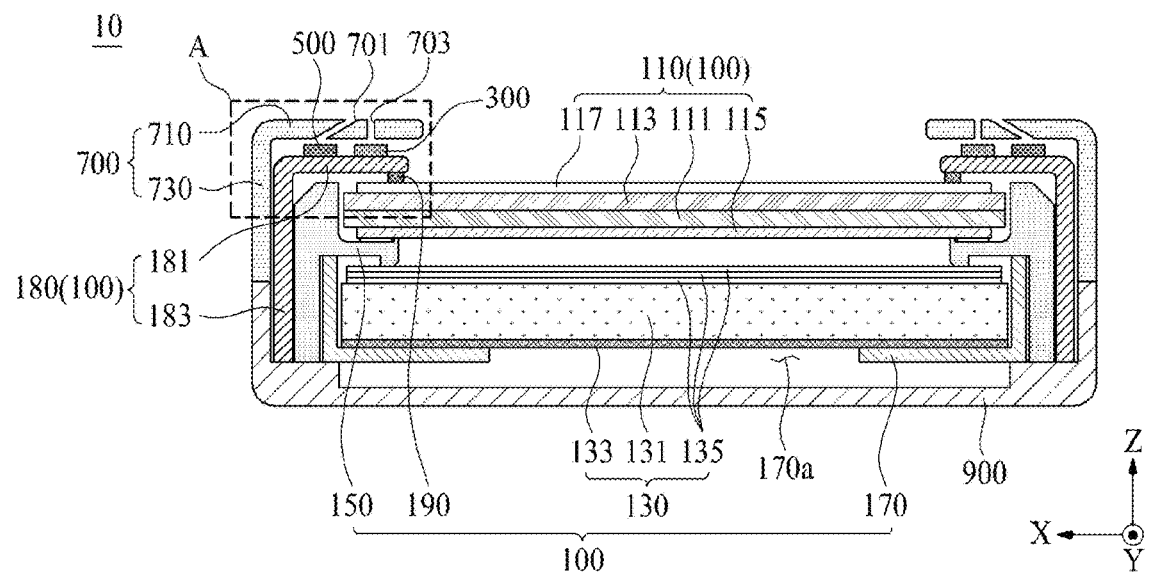
FIG. 1 is a diagram schematically illustrating a display apparatus according to a first embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an embodiment, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for embodiment, when a position relation between two parts is described as "on~," "over~," "under~," and "next~," one or more other parts may be disposed between the two parts unless "just" or "direct" is used.

In describing a time relationship, for embodiment, when the temporal order is described as "after~," "subsequent~," "next~," and "before~," a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled or connected to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a display apparatus and a computing apparatus using the same according to the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 2:
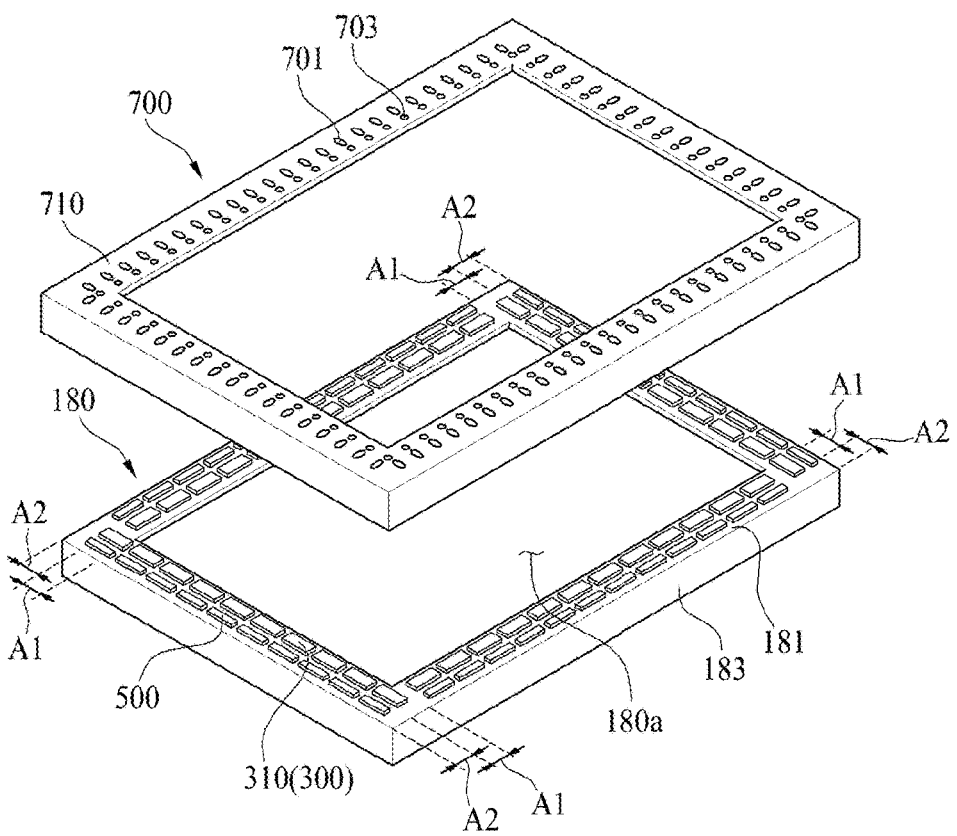
FIG. 2 is a diagram illustrating a sound generation module, ultrasonic generation modules, and first and second through-holes illustrated in FIG. 1.

FIG. 1 is a diagram schematically illustrating a display apparatus according to a first embodiment of the present disclosure, and FIG. 2 is a diagram illustrating a sound generation module, ultrasonic generation modules, and first and second through-holes shown in FIG. 1.

With reference to FIGS. 1 and 2, a display apparatus 10 according to a first embodiment of the present disclosure may include a display module 100, a sound generation module 300, a plurality of ultrasonic generation modules 500, and a front cover 700.

The display module 100 may display an image, and may be vibrated in order to output a sound forwards by the driving of the sound generation module 300.

The display module 100 according to an embodiment may be a liquid crystal display module or any other type of display module that outputs light. For example, the display module 100 may include a display panel 110, a backlight unit 130, a guide frame 150, a support cover 170, and a front case 180.

The display panel 110 may include a display area for displaying an image and a non-display area surrounding the display area. The display panel 110 according to an embodiment may include a first substrate 111 and a second substrate 113 laminated opposite each other in the state in which a liquid crystal layer is interposed therebetween, a first polarization film 115 attached to the rear surface of the first substrate 111, and a second polarization film 117 attached to the front surface of the second substrate 113. In the display panel 110, the liquid crystal layer may be driven according to an electric field formed at each pixel by a common voltage and a data voltage applied to each pixel, and an image is displayed by light transmitted through the liquid crystal layer.

The backlight unit 130 may be disposed at the rear surface of the display panel 110 in order to emit light to the display panel 110. The backlight unit 130 according to an embodiment may include a light guide plate 131 disposed at the rear surface of the display panel 110, a light source module including a plurality of light-emitting diode packages for emitting light to at least one side surface of the light guide plate 131, a reflective sheet 133 disposed at the rear surface of the light guide plate 131, and an optical sheet 135 disposed on the light guide plate 131.

The guide frame 150 may support the rear edge (or periphery) of the display panel 110. In addition, the guide frame 150 may cover the side surfaces of the display panel 110. The guide frame 150 according to an embodiment may be formed in the shape of a quadrangular band corresponding to the rear edge (or periphery) of the display panel 110. For example, the guide frame 150 may be coupled or connected to the rear edge (or periphery) of the display panel 110 by an adhesive member.

The support cover 170 may have therein an opening 170*a* formed so as to overlap the remaining portion of the backlight unit 130, excluding the rear edge (or periphery) thereof, and may support the rear edge (or periphery) of the backlight unit 130 and the guide frame 150. The support cover 170 may receive the backlight unit 130 therein, and may cover the side surfaces of the backlight unit 130. Each side surface of the support cover 170 may be covered by the guide frame 150. The support cover 170 according to an embodiment may be made of a metal material, such as aluminum or an aluminum alloy.

The front case 180 may cover the front edge (or periphery) of the display panel 110, and may support the sound generation module 300. The front case 180 may cover each side surface of the display panel 110 and each side surface of the guide frame 150. The front case 180 covers the non-display area of the display panel 110, excluding the display area thereof, in order to hide the remaining portion of the display module 100, excluding the display area of the display panel 110.

The front case 180 also serves as a vibration plate that is vibrated to generate a sound by the driving of the sound generation module 300. In order to serve as the vibration plate, the front case 180 may be made of a metal material. For example, the front case 180 may be made of one of electrolytically galvanized iron, a magnesium alloy, a magnesium-lithium alloy, and an aluminum alloy. The front case 180 may be expressed as a front housing, a top case, or a sound generation case, but the term is not limited thereto.

The front case 180 according to an embodiment may include a front part 181 for covering the front edge (or periphery) of the display panel 110 and supporting the sound generation module 30, and a side part 183 bent from the front part 181 for covering each side surface of the guide frame 150.

The front part 181 (or a front plate) may be formed in the shape of a quadrangular frame including an opening 180*a* corresponding to the display area of the display panel 110. The front part 181 may cover the non-display area of the display panel 110, and may support the sound generation module 300 and the ultrasonic generation modules 500. The front part 181 according to an embodiment may include a first area A1 for supporting the sound generation module 300 and a second area A2 for supporting the ultrasonic generation modules 500.

The side part 183 may have a shape of a quadrangular frame that is connected perpendicularly to an end of the front part 181 and surrounds each side surface of the guide frame 150.

The display module 100 according to an embodiment may further include a pad member 190 disposed between the front case 180 and the display panel 110.

The pad member 190 may be interposed between the front case 180 and the display panel 110. The pad member 190 may prevent or block physical contact between the front case 180 and the display panel 110, and may absorb an external impact applied to the front case 180 in order to prevent or reduce damage to the display panel 110 due to the external impact. In addition, the pad member 190 may prevent or block moisture or foreign matter from permeating into the display module 100 through a gap or space defined between the front case 180 and the display panel 110.

The pad member 190 according to an embodiment may be a single-sided foam pad having elastic force or a double-sided foam pad having elastic force. As another example, the pad member 190 may contain a moisture absorbent for absorbing a liquid material, such as moisture, running down the front surface of the display panel 110, which stands vertically.

The sound generation module 300 is disposed at the display module 100, and vibrates the display module 100 to generate a sound. For example, the display module 100 may output a sound, generated as the result of the display module 100 being vibrated by the driving of the sound generation module 300, in front of the display panel 110. The sound generation module 300 according to an embodiment may include a piezoelectric device having a piezoelectric characteristic of vibrating due to a piezoelectric effect caused by an electric field. The sound generation module 300 may be expressed as a sound generator, a sound actuator, a film actuator, a sound-piezoelectric composite actuator, a film speaker, a film-type piezoelectric speaker, or a film-type sound-piezoelectric composite speaker that uses the display module 100 as a vibration plate, but the term is not limited thereto.

The sound generation module 300 according to an embodiment may be disposed on the front case 180 of the display module 100, and may vibrate the front case 180 in order to output a sound according to a sound driving signal applied thereto. That is, the sound generation module 300 may use the front case 180 as a vibration plate in order to output a sound. For example, the front case 180 may be spaced apart from the front surface of the display panel 110 by the thickness (or the height) of the pad member 190, and may be vibrated to output a sound by the vibration of the sound generation module 300.

The sound generation module 300 according to an embodiment may include a plurality of vibration devices 310 disposed at the front case 180 at uniform intervals or distances so as to surround the display area of the display panel 110.

The vibration devices 310 are disposed along the front part 181 of the front case 180 at predetermined intervals or distances so as to surround the display area of the display panel 110. The vibration devices 310 may be attached to the first area A1, defined on the front part 181 of the front case 180, by an adhesive member. For example, each of the vibration devices 310 may include a piezoelectric material having a piezoelectric characteristic. For example, each of the vibration devices 310 may be formed in the shape of a film. For example, each of the vibration devices 310 may be a film-type exciter, but the term is not limited thereto. The vibration devices 310 may vibrate the front part 181 of the front case 180 according to a sound driving signal applied thereto in order to generate a sound using the front part 181 of the front case 180 as a vibration plate.

The plurality of ultrasonic generation modules 500 may be disposed between the front edge (or periphery) of the display module 100 and the front cover 700. The plurality of ultrasonic generation modules 500 may be disposed at the display module 100, and may vibrate the display module 100 in order to generate ultrasonic waves. Each of the plurality of ultrasonic generation modules 500 according to an embodiment is attached to the front part 181 of the front case 180, and vibrates the front part 181 of the front case 180 according to an ultrasonic driving signal applied thereto in order to generate longitudinal wave type ultrasonic waves (or a directional wave or a directivity wave). A longitudinal wave is a wave, the direction of advancement of which is identical to the vibration direction thereof. The longitudinal wave has the highest speed among transverse waves, surface waves, and plate waves generated by the ultrasonic generation module 500, and has strong directivity.

The longitudinal wave type ultrasonic waves generated by the plurality of ultrasonic generation modules 500 may have directivity in a specific direction and may thus advance a sound generated by the vibration of the sound generation module 300. The longitudinal wave type ultrasonic waves may advance a sound generated by the sound generation module 300 toward a user located in front of the display apparatus 10.

The directional characteristic of each of the plurality of ultrasonic generation modules 500 may be expressed as a directivity (Qax) and a directivity index (DI). The directivity (Qax) may be defined as a value obtained by dividing sound pressure on the axis by sound pressure when a sound source is assumed to be non-directional, and the directivity index (DI) may be defined as 10× log (Qax). The value of directivity (Qax) of a non-directional sound source is '1'. The sharper the directivity of a sound source, the higher the value of the directivity (Qax) on the axis. Because ultrasonic waves have a high frequency and a short wavelength, the ultrasonic waves may advance in the form of a short pulse while the path of advancement of the ultrasonic waves has a directional characteristic due to strong vibration, whereby the ultrasonic waves may be directional. Thus, the plurality of ultrasonic generation modules 500 may generate longitudinal wave type ultrasonic waves having a frequency of 20 kHz to 40 kHz in order to advance a sound generated by the sound generation module 300 in a specific direction.

The plurality of ultrasonic generation modules 500 may be disposed in the second area A2 defined on the front part 181 of the front case 180 so as to surround the sound generation module 300. The plurality of ultrasonic generation modules 500 may be disposed outside (or on the outer side of) the sound generation module 300. For example, in the case in which the plurality of ultrasonic generation modules 500 are disposed inside (or on the inner side of) the sound generation module 300, a sound generated by the vibration of the sound generation module 300 may not pass through the path of advancement of the longitudinal wave type ultrasonic waves having directivity, and thus may not advance toward the front of the display area of the display panel 110 but may advance toward the outside of the display module 100. As a result, the sound may not reach a user located in front of the display panel 110. In order to propagate a sound generated by the vibration of the sound generation module 300 in a specific direction, therefore, the plurality of ultrasonic generation modules 500 may be disposed outside the sound generation module 300, e.g., between the side part 183 of the front case 180 and the sound generation module 300, so as to surround the sound generation module 300.

The front cover 700 covers the front edge (or periphery) of the display module 100. The front cover 700 according to an embodiment may cover the front case 180, the plurality of ultrasonic generation modules 500, and the sound generation module 300. In a final product for consumers or a finished display apparatus, the front cover 700 may be expressed as a front set cover, an outermost front structure, or a front product cover, but the term is not limited thereto.

The front cover 700 according to an embodiment may include a plurality of first through-holes 701 formed so as to overlap the respective ultrasonic generation modules 500.

The first through-holes 701 may be formed through the front cover 700 so as to overlap the respective ultrasonic generation modules 500. The first through-holes 701 may guide the path of advancement of the ultrasonic waves generated by the respective ultrasonic generation modules 500 in a specific direction. Thus, each of the first through-holes 701 may be expressed as an ultrasonic guider, but the term is not limited thereto.

The front cover 700 according to an embodiment may further include a plurality of second through-holes 703 formed so as to overlap the sound generation module 300. The second through-holes 703 may be formed through the front cover 700 so as to overlap the sound generation module 300. For example, the second through-holes 703 may be disposed parallel to the first through-holes 701. However, the present disclosure is not limited thereto. The second through-holes 703 may guide the path of advancement of a sound generated by the vibration of the sound generation module 300 in a specific direction. Thus, each of the second through-holes 703 may be expressed as a sound guider, but the term is not limited thereto.

The front cover 700 according to an embodiment may include a front cover part 710 and a side cover part 730.

The front cover part 710 covers all of the plurality of ultrasonic generation modules 500. The front cover part 710 may be disposed on the front part 181 of the front case 180, and may cover the front part 181 of the front case 180, the plurality of ultrasonic generation modules 500, and the sound generation module 300.

The front cover part 710 according to an embodiment may include a first area (or a first hole pattern part) formed so as to overlap all of the plurality of ultrasonic generation modules 500 and a second area (or a second hole pattern part) formed so as to overlap the sound generation module 300. For example, the first through-holes 701 may be formed through the first area of the front cover part 710, and the second through-holes 703 may be formed through the second area of the front cover part 710.

The side cover part 730 is connected to the front cover part 710 so as to cover the side surfaces of the display module 100. The side cover part 730 according to an embodiment may be bent perpendicularly from the end of the front cover part 710 so as to cover a space defined between the front cover part 710 and the front part 181 of the front case 180 and to cover the side part 183 of the front case 180.

The display apparatus 10 according to the first embodiment of the present disclosure may further include a rear cover 900.

The rear cover 900 stores or receives the display module 100 therein, and surrounds the side surfaces of the display module 100. In a final product for consumers or a finished display apparatus, the rear cover 900 may be expressed as a rear set cover, an outermost rear structure, or a rear product cover, but the term is not limited thereto.

Figure 3:
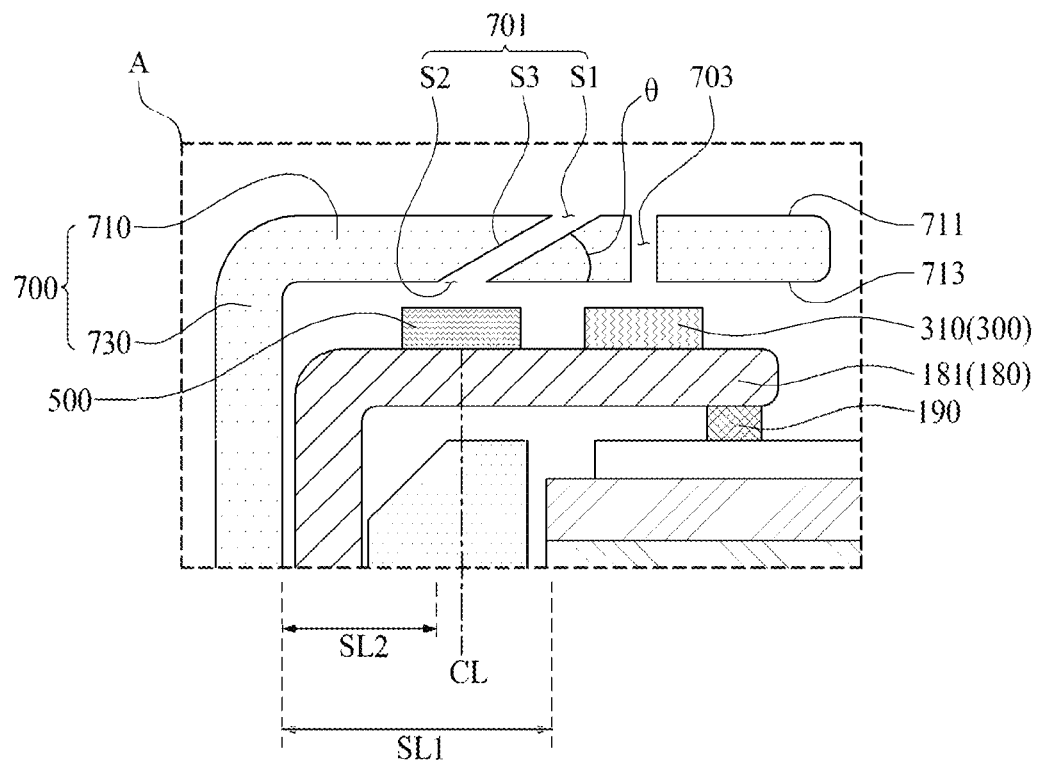
FIG. 3 is an enlarged view of part A illustrated in FIG. 1.

FIG. 3 is an enlarged view of part A illustrated in FIG. 1. FIG. 3 is a diagram illustrating the first and second through-holes.

With reference to FIGS. 1 to 3, the first through-holes 701 of the present disclosure may obliquely penetrate the front cover part 710 of the front cover 700 overlapping with the plurality of ultrasonic generation modules 500. The first through-holes 701 may obliquely guide the path of advancement of longitudinal wave type ultrasonic waves generated by the overlapping ultrasonic generation modules 500.

Each of the first through-holes 701 according to an embodiment may include a first side S1 exposed to the front surface 711 of the front cover part 710, a second side S2 exposed to the rear surface 713 of the front cover part 710, which is opposite the front surface 711, and an inclined surface S3 formed between the first side S1 and the second side S2. For example, the shortest distance SL1 between the first side of each of the first through-holes 701 and the side cover part 730 of the front cover 700 may be greater than the shortest distance SL2 between the second side of each of the first through-holes 701 and the side cover part 730. In one embodiment, the first side of each of the first through-holes 701 may be located so as to be biased to the sound generation module 300 from the center line CL of the ultrasonic generation modules 500, and the second side S2 may overlap or may not overlap the first side S1 depending on the diameter of each of the first through-holes 701 and the thickness of the front cover part 710. Thus, the first side S1 and the second side S2 of each of the first through-holes 701 may cross each other.

In addition, the angle θ (or the hole inclination angle) between the inclined surface S3 of an embodiment of each of the first through-holes 701 and the rear surface of the front cover part 710 may be an acute angle. For example, in the case in which the hole inclination angle θ of each of the first through-holes 701 is an acute angle, longitudinal wave type ultrasonic waves having directivity may advance a sound in a specific direction, and may be obliquely incident on the display panel 110 in order to generate plate wave type ultrasonic waves on the surface of the display panel 110 such that the surface of the display panel 110 is cleansed. The plate wave type ultrasonic waves may remove foreign matter from the display panel 110 such that the display panel 110 is cleansed by a cavitation phenomenon while propagating along the surface of the display panel 110.

In one embodiment, in the case in which the display apparatus 10 according to the first embodiment of the present disclosure is applied to a monitor that is used in a vertically standing and fixed state, the hole inclination angle θ of each of the first through-holes 701 may be set within a range of 45 to 90 degrees. In the case in which the hole inclination angle deviates from the above range, a sound generated by the vibration of the sound generation module 300 may not reach a user located in front of the display panel 110. For example, in the case in which the hole inclination angle θ of each of the first through-holes 701 is set to 45 to 90 degrees on the assumption that the viewing distance of the monitor is 60 cm, a sound generated by the vibration of the sound generation module 300 may be concentrated on the ears of a viewer located 60 cm distant from the screen of the monitor using longitudinal wave type ultrasonic waves having directivity, and plate wave type ultrasonic waves may be generated on the display panel 110 in order to cleanse the surface of the display panel 110.

In another embodiment, in the case in which the display apparatus 10 according to the first embodiment of the present disclosure is applied to a notebook computer or a tablet computer that is used in an inclined state, the hole inclination angle θ of each of the first through-holes 701 may be set within a range of 15 to 30 degrees. In the case in which the hole inclination angle deviates from the above range, a sound generated by the vibration of the sound generation module 300 may not reach a user located in front of the display panel 110. For example, in the case in which the hole inclination angle θ of each of the first through-holes 701 is set to 15 to 30 degrees on the assumption that the viewing distance of the screen of the notebook computer is 30 to 60 cm, a sound generated by the vibration of the sound generation module 300 may be concentrated on the ears of a viewer located 60 cm distant from the inclined screen of the notebook computer using longitudinal wave type ultrasonic waves having directivity, and plate wave type ultrasonic waves may be generated on the display panel 110 in order to cleanse the surface of the display panel 110.

Each of the second through-holes 703 according to an embodiment may perpendicularly or obliquely penetrate the front cover part 710 of the front cover 700 overlapping with the sound generation module 300. The second through-holes 703 serve as a sound channel through which a sound generated by the vibration of the sound generation module 300 advances to the front of the display panel 110. In one embodiment, the second through-holes 703 may be inclined so as to have an inclination identical to or different from the inclination of the first through-holes 701. For example, the angle between the rear surface of the front cover part 710 and each of the second through-holes 703 may be an acute angle.

Each of the second through-holes 703 according to an embodiment may be formed parallel to a corresponding one of the first through-holes 701. A sound passing through the second through-holes 703 may be concentrated on a viewer located in front of the display panel 110 by longitudinal wave type ultrasonic waves passing through the first through-holes 701.

In the display apparatus 10 according to the first embodiment of the present disclosure, a sound generated from the display module 100, for example the front case 180, vibrated according to the vibration of the sound generation module 300, which is disposed at the front edge (or periphery) of the display module 100, may be output to the front of the display module 100, whereby a viewer's immersion experience may be enhanced due to harmony (or matching) between an image and the sound. Also, in the display apparatus 10 according to the first embodiment of the present disclosure, a sound generated from the display module 100 vibrated according to the vibration of the sound generation module 300 may be concentrated only on a user located in front of the display panel 110 using the directivity of longitudinal wave type ultrasonic waves generated by the ultrasonic generation modules 500, whereby no sound may be heard in regions other than the region in which the user is located, and therefore a user privacy protection function may be realized.

Furthermore, in the display apparatus 10 according to the first embodiment of the present disclosure, contaminants may be removed from the surface of the display panel 110 by plate wave type ultrasonic waves generated on the display panel 110 due to the longitudinal wave type ultrasonic waves, whereby a self-cleaning function may be realized.

Figure 4:
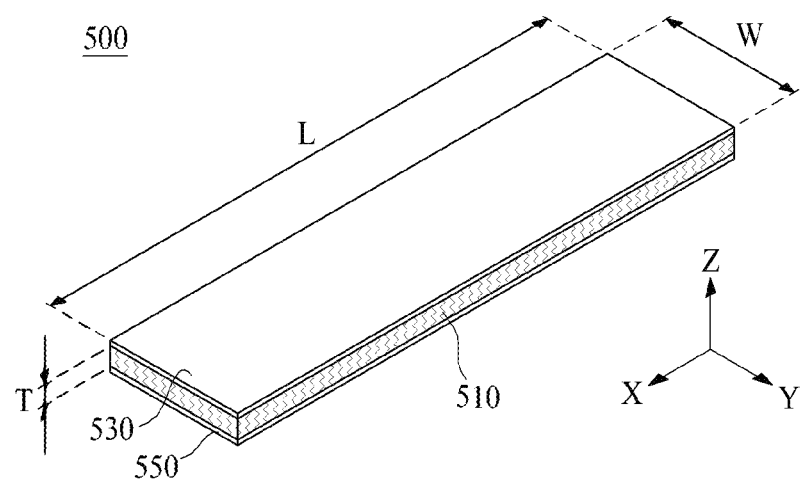
FIG. 4 is a diagram illustrating one of the ultrasonic generation modules illustrated in FIG. 1.

FIG. 4 is a diagram illustrating one of the ultrasonic generation modules shown in FIG. 1.

With reference to FIG. 4, an ultrasonic generation module 500 according to an embodiment of the present disclosure may include a piezoelectric body 510, a first electrode part 530, and a second electrode part 550.

The piezoelectric body 510 may include an inorganic material or a piezoelectric material that is vibrated due to a piezoelectric effect (or a piezoelectric characteristic) caused by an electric field. The piezoelectric body 510 may be expressed as an electric activation part, an inorganic material part, a piezoelectric material part, or a vibration part, but the term is not limited thereto.

The piezoelectric body 510 according to an embodiment may include a flat piezoelectric polymer or flat piezoelectric ceramic, but the term is not limited thereto. The piezoelectric body 510 may include a material capable of generating longitudinal wave type ultrasonic waves having a frequency of 20 kHz to 40 kHz.

The piezoelectric body 510 according to an embodiment may be made of a ceramic material that is capable of generating relatively high vibration, or a piezoelectric ceramic having a perovskite-based crystalline structure. The perovskite crystalline structure may have a piezoelectric effect and an inverse piezoelectric effect, and may be a plate-shaped structure having an orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A" and "B" may be cations, and "0" may be anions. For example, the chemical formula "$ABO_3$" may include one of $PbTiO_3$, $PbZrO_3$, $BaTiO_3$, and $SrTiO_3$, but is not limited thereto.

In a case where the perovskite crystalline structure includes a center ion (for embodiment, $PbTiO_3$), a position of a Ti ion may be changed by an external stress or a magnetic field, and thus, polarization may be changed, thereby generating a piezoelectric effect. For example, in the perovskite crystalline structure, a cubic shape corresponding to a symmetric structure may be changed to a tetragonal, orthorhombic, or rhombohedral structure corresponding to an unsymmetric structure, and thus, a piezoelectric effect may be generated. In a tetragonal, orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

In one embodiment, the piezoelectric body 510 may include one or more materials of lead (Pb), zirconium (Zr), titanium (Ti), zinc (Zn), nickel (Ni), and niobium (Nb), but is not limited thereto.

In another embodiment, the piezoelectric body 510 may include a lead zirconate titanate (PZT)-based material including lead (Pb), zirconium (Zr), and titanium (Ti), or may include a lead zirconate nickel niobate (PZNN)-based material including lead (Pb), zinc (Zn), nickel (Ni), and niobium (Nb), but is not limited thereto. Also, the inorganic material portion may include at least one of $CaTiO_3$, $BaTiO_3$, and $SrTiO_3$, each without lead (Pb), but is not limited thereto.

The piezoelectric body 510 may generate longitudinal wave type ultrasonic waves having a frequency of 20 kHz to 40 kHz due to an electric field applied thereto. In one embodiment, the width W of the piezoelectric body 510 may be greater than the thickness T of the piezoelectric body 510, and the length of the piezoelectric body 510 may be 4 times or more of the width of the piezoelectric body 510 (4×W). For example, the piezoelectric body 510 may have a length L of 90 mm or less, a width W of 30 mm or less, and a thickness T of 2 mm or more.

The first electrode part 530 is disposed on the first surface (or the front surface) of the piezoelectric body 510, and is electrically connected to the first surface of the piezoelectric body 510. The first electrode part 530 according to an embodiment may be made of a transparent conductive material, a semitransparent conductive material, or an opaque conductive material.

The second electrode part 550 is disposed on the second surface (or the rear surface) of the piezoelectric body 510, which is opposite the first surface thereof, and is electrically connected to the second surface of the piezoelectric body 510. The second electrode part 550 according to an embodiment may be made of the same conductive material as the first electrode part 530.

The ultrasonic generation module 500 according to the embodiment of the present disclosure may further include a protective film for covering the first electrode part 530 and the second electrode part 550.

The protective film may protect the first electrode part 530 and the second electrode part 550. For example, the protective film may be a polyimide (PI) film or a polyethylene terephthalate (PET) film, but is not limited thereto.

The ultrasonic generation module 500 according to the embodiment of the present disclosure, as described above, may generate longitudinal wave type ultrasonic waves having a frequency of 20 kHz to 40 kHz according to an ultrasonic driving signal applied to the first electrode part 530 and the second electrode part 550.

Meanwhile, a sound generation module or a vibration device according to an embodiment of the present disclosure may have the same structure as the ultrasonic generation module shown in FIG. 4, or may have a structure different from the structure of the ultrasonic generation module, depending on the sound pressure characteristic and the reproduction band characteristic of a sound. For example, as shown in FIG. 2, the sound generation module 300 or the vibration device 310 may have the same thickness and length as the ultrasonic generation module 500, but may have a width different from the width of the ultrasonic generation module 500.

Figure 5:
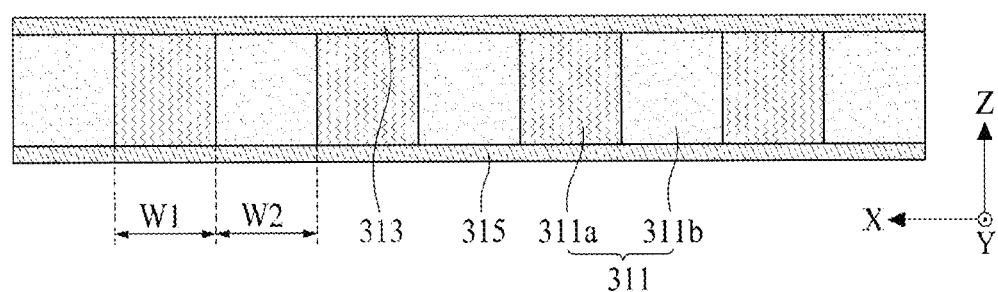
FIG. 5 is a cross-sectional view of the sound generation module illustrated in FIG. 1.
Figure 6:
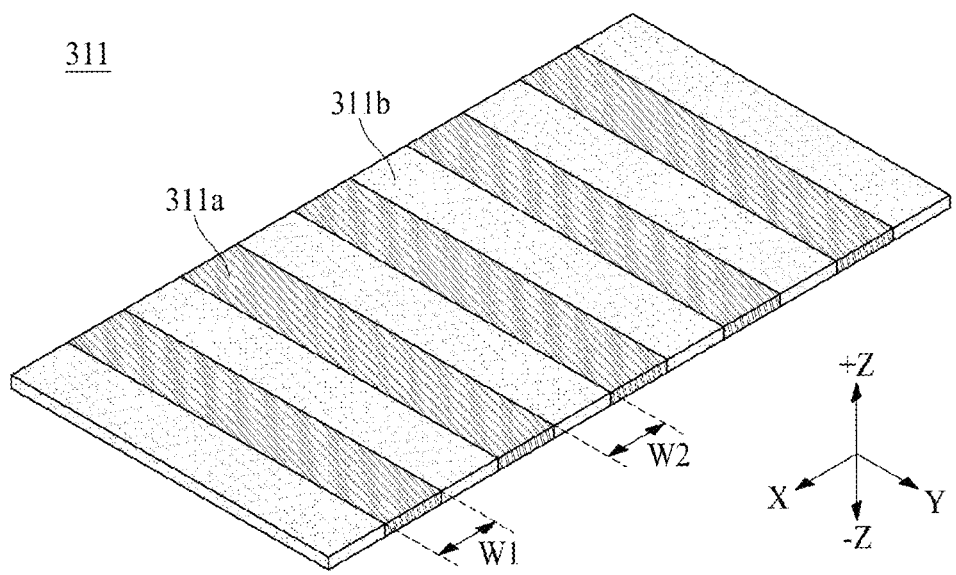
FIG. 6 is a diagram illustrating a piezoelectric composite layer illustrated in FIG. 5.

FIG. 5 is a cross-sectional view of the sound generation module shown in FIG. 1, and FIG. 6 is a diagram illustrating a piezoelectric composite layer shown in FIG. 5.

With reference to FIGS. 5 and 6, a sound generation module 300 (or a vibration device 310) according to an embodiment of the present disclosure may include a piezoelectric composite layer 311, a first electrode layer 313, and a second electrode layer 315.

The piezoelectric composite layer 311 according to an embodiment may include a plurality of piezoelectric parts 311a and a plurality of flexible parts 311b disposed between the plurality of piezoelectric parts 311a.

The piezoelectric parts 311a and the flexible parts 311b may be disposed (or arranged) in parallel on the same plane (or on the same layer) to each other. For example, because the vibration energy of the piezoelectric parts 311a due to a link in a unit lattice is increased by the flexible parts 311b, the vibration of the piezoelectric composite layer 311 may be increased, whereby the piezoelectric characteristic and the flexibility of the piezoelectric composite layer 311 may be achieved. In addition, because the flexible parts 311b and the piezoelectric parts 311a are alternately disposed in the same plane in the longitudinal direction from one side of the piezoelectric composite layer 311, the piezoelectric composite layer 311 may constitute a large-area composite film (or an organic/inorganic composite film) having a single-layer structure. The large-area composite film may have improved flexibility due to the flexible parts 311b.

Each of the piezoelectric parts 311a may include a polygonal pattern. Each of the piezoelectric parts 311a according to an embodiment may be a line pattern having a predetermined first width W1. The piezoelectric parts 311a may be spaced apart from each other by a predetermined second width (or a predetermined distance) in a first direction X, and may be disposed side by side in a second direction Y, which intersects the first direction X. In one embodiment, the piezoelectric parts 311a may have the same size within a process error (or an allowable error or a tolerance) range generated during a manufacturing process. In another embodiment, the piezoelectric parts 311a may have different sizes depending on the position and/or shape thereof, or at least one of the piezoelectric parts 311a may have a different size. In another embodiment, the sizes of the piezoelectric parts 311a may increase or decrease progressively in a direction from opposite ends to the middle of the piezoelectric composite layer 311. In another embodiment, the sizes of the piezoelectric parts 311a may increase or decrease progressively in a direction from one end to the other end of the piezoelectric composite layer 311. For example, the size of each of the piezoelectric parts 311a may be defined as one of a breadth, an area, a length, a width, a thickness, and a volume. In another embodiment, the distances between the respective piezoelectric parts 311a may be the same as or different from each other. In another embodiment, the distances between the respective piezoelectric parts 311a may increase or decrease progressively in a direction from both ends to the center portion of the piezoelectric composite layer 311. In a further embodiment, the distances between the respective piezoelectric parts 311a may increase or decrease progressively in a direction from one end to the other end of the piezoelectric composite layer 311.

Each of the piezoelectric parts 311a according to an embodiment may include an inorganic material or a piezoelectric material that is vibrated due to a piezoelectric characteristic caused by an electric field. For example, each of the piezoelectric parts 311a may be expressed as an electric activation part, an inorganic material part, a piezoelectric material part, or a vibration part, but the term is not limited thereto. Each of the piezoelectric parts 311a includes the same material as the piezoelectric body 510 shown in FIG. 4, and therefore a duplicate description thereof will be omitted.

Each of the flexible parts 311b may include a polygonal pattern. The flexible parts 311b may be disposed between the plurality of piezoelectric parts 311a, may improve an impact resistance of the piezoelectric portions 311a, and may provide flexibility to the sound generation module 300 (or the vibration device 310). Each of the flexible parts 311b may be expressed as an organic material part, an elastic part, a bending part, a damping part, or a connection part that is flexible, but the term is not limited thereto.

Because each of the flexible parts 311b may be configured to fill a gap or space between two adjacent piezoelectric parts 311a, each of the plurality of flexible parts 311b may be connected or attached to adjacent piezoelectric parts 311a. For example, each of the flexible parts 311b may be a line pattern having a predetermined second width W2. The flexible parts 311b may be disposed side by side in the state in which the piezoelectric parts 311a are disposed between the respective flexible parts 311b. Each of the flexible parts 311b may have a size corresponding to the distance between the respective piezoelectric parts 311a. The size of the flexible parts 311b may be equal to or different from the size of the piezoelectric parts 311a. The sizes of the piezoelectric parts 311a and the flexible parts 311b may adjust depending on requirements such as the vibration characteristic and/or the flexibility of the sound generation module 300 (or the vibration device 310). In one embodiment, for a display panel that requires a piezoelectric characteristic rather than flexibility, the size of the piezoelectric parts 311a may be greater than the size of the flexible parts 311b. In another embodiment, for a display panel that requires flexibility rather than a piezoelectric characteristic, the size of the flexible parts 311b may be greater than the size of the piezoelectric parts 311a.

Each of the flexible parts 311b may be made of an organic material or an organic polymer having greater flexibility than the piezoelectric parts 311a. For example, each of the flexible parts 311b may include an organic material, an organic polymer, an organic piezoelectric material, or an organic non-piezoelectric material.

Each of the flexible parts 311b according to an embodiment may include at least one of an organic piezoelectric material or an organic non-piezoelectric material.

Flexible parts 311b including an organic piezoelectric material may absorb an impact applied to the piezoelectric parts 311a, thereby enhancing the total durability of the sound generation module 300 and providing a desired piezoelectric characteristic. The organic piezoelectric material according to an embodiment may be an organic material having an electric activation characteristic. For example, the organic piezoelectric material included the flexible parts 311b may include at least one of polyvinylidene fluoride (PVDF), β-Polyvinylidene fluoride (β-PVDF), polyvinylidene-trifluoroethylene (PVDF-TrFE), and polyvinylidene-trifluoroethylene-chloro fluoro ethelene (PVDF-TrFE-CFE), but is not limited thereto.

Flexible parts 311b including an organic non-piezoelectric material, each of which is constituted by a curable resin composition and an adhesive including the same, may absorb an impact applied to the piezoelectric parts 311a, thereby enhancing the total durability of the sound generation module 300 (or the vibration device 310). The organic non-piezoelectric material included in the flexible parts 311b may include at least one of an epoxy-based polymer, an acryl-based polymer, and a silicon-based polymer, but is not limited thereto.

In the piezoelectric composite layer 311 according to the present embodiment, the flexible parts 311b made of an organic material having flexibility and the piezoelectric parts 311a made of an inorganic material having a piezoelectric characteristic may be alternately repeated and disposed (or arranged) on the same plane (or the same layer) in the longitudinal direction X of the sound generation module 300 (or the vibration device 310), and thus may configure a large-area composite film (or an organic/inorganic composite film) having a single-layer structure. The large-area composite film may have flexibility due to the plurality of flexible parts 311b.

The piezoelectric composite layer 311 according to the present embodiment may vibrate with an electric field based on a signal applied to each of the plurality of first portions 210 having a line pattern, and thus, both ends in the first longitudinal direction X may be folded in an upward direction +Z or folded in a downward direction −Z. For example, each of the plurality of flexible parts 311b filled or disposed between two adjacent the plurality of piezoelectric parts 311a may have flexibility, and thus, even when the both ends of the piezoelectric composite layer 311 are bent in the upward direction +Z or the downward direction −Z, the plurality of piezoelectric parts 311a may not be damaged or may not be reduced in performance.

The first electrode layer 313 may be disposed on the first surface (or the front surface) of the piezoelectric composite layer 311 and may be electrically connected to the first surface of each of the piezoelectric parts 311a disposed on the piezoelectric composite layer 311. The first electrode layer 313 according to an embodiment may include a transparent conductive material, a semitransparent conductive material, or an opaque conductive material.

The second electrode layer 315 may be disposed on the second surface (or the rear surface), which is opposite the first surface thereof, of the piezoelectric composite layer 311 and may be electrically connected to the second surface of each of the piezoelectric parts 311a disposed on the piezoelectric composite layer 311. The second electrode layer 315 according to an embodiment may include the same material as the first electrode layer 313.

The sound generation module 300 (or the vibration device 310) according to the embodiment of the present disclosure may further include a protective film for covering the first electrode layer 313 and the second electrode layer 315.

The protective film may protect the first electrode layer 313 and the second electrode layer 315. For example, the protective film may be a polyimide (PI) film or a polyethylene terephthalate (PET) film, but is not limited thereto.

Therefore, in the sound generation module 300 (or the vibration device 310) according to the embodiment of the present disclosure, the piezoelectric parts 311a disposed on the piezoelectric composite layer 311 may vibrate by an electric field according to a sound driving signal applied to the first electrode layer 313 and the second electrode layer 315, and thus, the display module may vibrate to output a sound. In addition, the sound generation module 300 (or the vibration device 310) may have flexibility due to the plurality of flexible parts 311b filled between the plurality of piezoelectric parts 311a, and thus, may not be damaged or may not be reduced in performance by an external impact.

Meanwhile, as shown in FIG. 2, the sound generation module 300 (or the vibration device 310) according to the embodiment of the present disclosure may have the same thickness and length as the ultrasonic generation module 500, and may have a width different from the width of the ultrasonic generation module 500.

Figure 7:
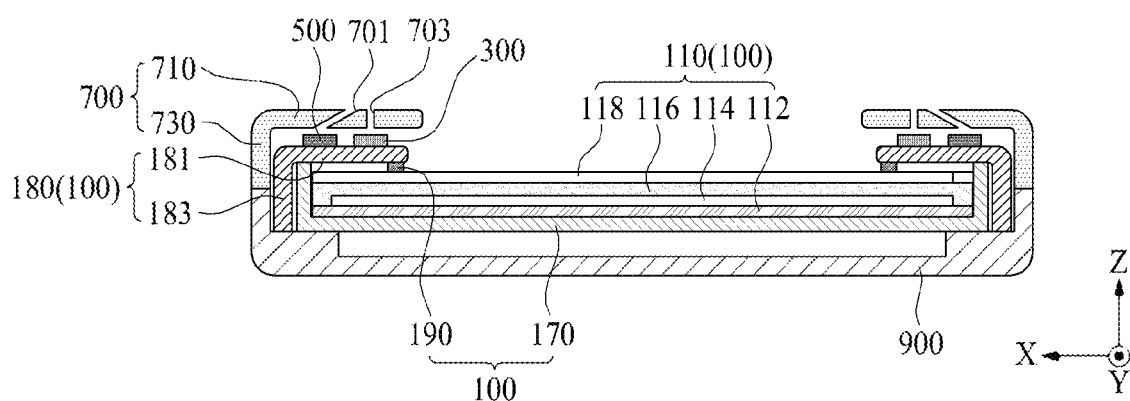
FIG. 7 is a diagram schematically illustrating a display apparatus according to a second embodiment of the present disclosure.

FIG. 7 is a diagram schematically illustrating a display apparatus according to a second embodiment of the present disclosure, in which the display module of the display apparatus shown in FIG. 1 is modified. Hereinafter, a duplicate description of components identical to or corresponding to the components shown in FIGS. 1 to 6 will be omitted, and only different components will be described.

With reference to FIG. 7, in a display apparatus 20 according to a second embodiment of the present disclosure, a display module 100 may be a self-emitting display module, such as an organic light emitting display module, a quantum dot light emitting display module, a micro light emitting diode display module, or any other type of display module that outputs light.

The display module 100 according to an embodiment may include a display panel 110, a support cover 170, and a front case 180.

The display panel 110 may be a light emitting display module. The display panel 110 according to an embodiment may include a pixel array substrate 112 having a pixel array 114 including a plurality of pixels, an encapsulation layer 116 for encapsulating the pixel array 114, and an optical film 118 attached to the upper surface of the encapsulation layer 116.

The pixels are provided at pixel regions defined by pixel driving lines. Each of the pixels may include a pixel circuit having at least two thin film transistors, at least one capacitor, and a light emitting device that emits light due to current supplied from the pixel circuit. In one embodiment, the light emitting device may include an organic light emitting layer or a quantum dot light emitting layer. In another embodiment, the light emitting device may include a micro light emitting diode.

The encapsulation layer 116 protects the thin film transistors and the light-emitting device from external impact, and prevents or blocks moisture from permeating into the light-emitting device.

The optical film 118 is attached to the upper surface of the encapsulation layer 116 by a transparent adhesive member. The optical film 118 may be a polarization film that changes external light, reflected by the thin film transistors provided at the pixel array substrate 112 and/or the pixel driving lines, into circularly polarized light in order to improve the visibility and contrast ratio of the display panel 110.

In addition, the display panel 110 may further include a barrier layer and a touch electrode layer interposed between the encapsulation layer 116 and the optical film 118. Furthermore, the display panel 110 may further include a color filter layer provided at the upper surface of the encapsulation layer 116.

Meanwhile, the encapsulation layer 116 may be replaced by an encapsulation substrate attached to the pixel array substrate 112 by a filling member surrounding the pixel array 114. In the case in which the filling member is transparent, the encapsulation substrate may also be transparent.

The support cover 170 may support the display panel 110, and may surround the rear surface and the side surfaces of the display panel 110. The support cover 170 according to an embodiment may be made of a metal material, such as aluminum or an aluminum alloy.

The front case 180 may cover the front edge (or periphery) of the display panel 110, and may support a sound generation module 300. In addition, the front case 180 may support a plurality of ultrasonic generation modules 500. The front case 180 covers the non-display area of the display panel 110, excluding the display area thereof, in order to hide the remaining portion of the display module 100, excluding the display area of the display panel 110.

The front case 180 is used as a vibration plate for the ultrasonic generation modules 500 and the sound generation module 300. The front case 180 is substantially identical to the front case shown in FIG. 1, and therefore a duplicate description thereof will be omitted.

The display apparatus 20 according to the second embodiment of the present disclosure is substantially identical to the display apparatus 10 according to the first embodiment of the present disclosure shown in FIGS. 1 to 6, except that a self-emitting display module is used as the display module 100, and therefore the display apparatus 20 according to the second embodiment of the present disclosure may have the same effects as the display apparatus 10 according to the first embodiment of the present disclosure.

Figure 8:
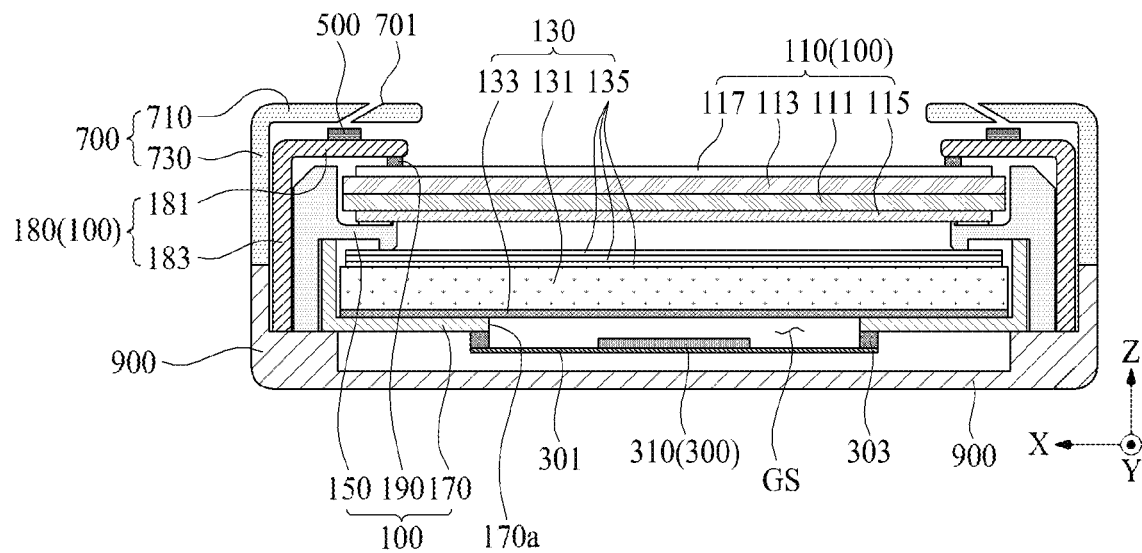
FIG. 8 is a diagram schematically illustrating a display apparatus according to a third embodiment of the present disclosure.
Figure 9:
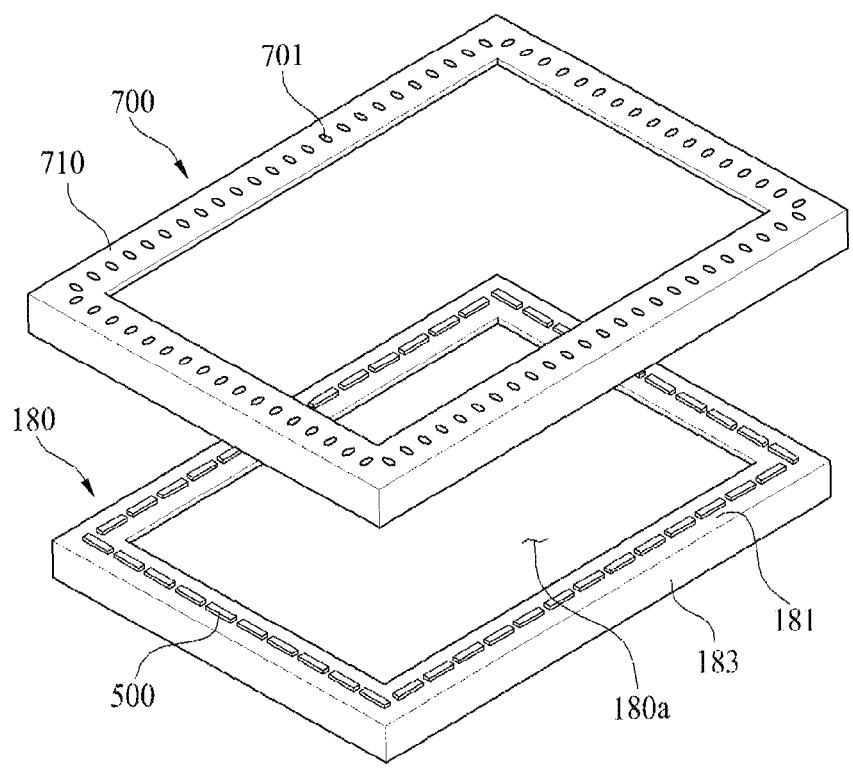
FIG. 9 is a diagram illustrating ultrasonic generation modules and first through-holes illustrated in FIG. 8.

FIG. 8 is a diagram schematically illustrating a display apparatus according to a third embodiment of the present disclosure, and FIG. 9 is a diagram illustrating ultrasonic generation modules and first through-holes illustrated in FIG. 8. In this embodiment, the sound generation components of the display apparatus shown in FIG. 1 are modified. Hereinafter, a duplicate description of components identical to or corresponding to the components shown in FIGS. 1 to 6 will be omitted or given briefly.

With reference to FIGS. 8 and 9, a display apparatus 30 according to a third embodiment of the present disclosure may include a display module 100, a sound generation module 300, a plurality of ultrasonic generation modules 500, and a front cover 700.

The display module 100 is substantially identical to the display module shown in FIG. 1, and therefore a duplicate description thereof will be omitted.

The sound generation module 300 according to this embodiment may include a vibration plate 301 and at least one vibration device 310 disposed at the vibration plate 301.

The vibration plate 301 may be coupled or connected to the rear surface of the display module 100 via a plate-fixing member 303. An embodiment of the vibration plate 301 may cover an opening 170a formed in a support cover 170 constituting the display module 100. The vibration plate 301 according to an embodiment may be made of one of a magnesium (Mg) alloy material, a magnesium-lithium (Mg—Li) alloy material, and an aluminum (Al) alloy material. The magnesium alloy material may contain at least one of aluminum, zinc (Zn), or manganese (Mn), but is not limited thereto.

The plate-fixing member 303 may be interposed between the front edge (or periphery) of the vibration plate 301 and the support cover 170 in order to couple the vibration plate 301 to the support cover 170 and to provide a gap space GS between a backlight unit 130 and the vibration plate 301. The gap space GS may be defined so as to serve as a vibration space for the vibration of the vibration plate 301 and the vibration of the display module 100 according to the vibration of the vibration plate 301. The plate-fixing member 303 according to an embodiment may be a double-sided adhesive tape or an adhesive resin. The double-sided adhesive tape may include a pad having a predetermined height (or a predetermined thickness) or a foam pad. The adhesive resin may include an acrylic-based material or a urethane-based material. In an example, the adhesive resin is made of a urethane-based material, which is more flexible than an acrylic-based material, in order to minimize or reduce the vibration of the plate-fixing member 303 directly transmitted to the display module 100.

The at least one vibration device 310 is attached to the vibration plate 301 so as to be vibrated according to a sound driving signal applied thereto in order to vibrate the vibration plate 301. In one embodiment, the at least one vibration device 310 may be disposed at a first surface of the vibration plate 301, which directly faces the backlight unit 130. In another embodiment, the at least one vibration device 310 may be disposed at a second surface of the vibration plate 301, which directly faces a rear cover 900. The at least one vibration device 310 is identical to the ultrasonic generation module shown in FIG. 4 or to the sound generation module shown in FIG. 5, and therefore a duplicate description thereof will be omitted.

The at least one vibration device 310 may vibrate the vibration plate 301 according to a sound driving signal in order to generate sound pressure in the gap space such that the display panel 110 is indirectly vibrated to generate a sound. That is, when the at least one vibration device 310 is vibrated according to a sound driving signal, sound pressure is generated in the gap space GS by the vibration of the vibration plate 301. The display module 100 is vibrated by the sound pressure generated in the gap space GS, and a sound generated from the display panel 110, which is vibrated according to the vibration of the display module 100, is output from the front of the display panel 110.

The ultrasonic generation modules 500 may be disposed between the front edge (or periphery) of the display module 100 and the front cover 700. The ultrasonic generation modules 500 are disposed at the display module 100 and vibrate the display module 100 in order to generate ultrasonic waves. Each of the ultrasonic generation modules 500 according to an embodiment is attached to a front part 181 of a front case 180, and vibrates the front part 181 of the front case 180 according to an ultrasonic driving signal applied thereto in order to generate longitudinal wave type ultrasonic waves (or a directional signal). The ultrasonic generation modules 500 are identical to the ultrasonic generation modules shown in FIGS. 1 and 2, except that the ultrasonic generation modules 500 are disposed at predetermined intervals or distances along the middle line of the front part 181 of the front case 180, and therefore a duplicate description thereof will be omitted.

The front cover 700 covers the front edge (or periphery) of the display module 100. The front cover 700 according to an embodiment may cover the front case 180 and the ultrasonic generation modules 500. The front cover 700 is identical to the front cover shown in FIGS. 1 and 2, except that a plurality of second through-holes 703 is not formed in the front cover 700, and therefore a duplicate description thereof will be omitted.

An embodiment of the front cover 700 may include a plurality of first through-holes 701 overlapping with the plurality of ultrasonic generation modules 500.

Each of the plurality of first through-holes 701 may obliquely penetrate a front cover part 710 of the front cover 700 overlapping with the plurality of ultrasonic generation modules 500. Each of the plurality of first through-holes 701 are identical to the first through-holes shown in FIGS. 1 and 2, and therefore a duplicate description thereof will be omitted.

In the display apparatus 30 according to the third embodiment of the present disclosure, a sound may be generated from the display panel 110 vibrated according to the vibration of the sound generation module 300 disposed at the rear surface of the display module 100, and may be output to the front of the display panel 110. Thus, a viewer's immersion experience may be enhanced due to harmony (or matching) between an image and the sound. Also, in the display apparatus 30 according to the third embodiment of the present disclosure, a sound generated from the display panel 110 vibrated according to the vibration of the sound generation module 300 may be concentrated only on a user located in front of the display panel 110, using the directivity of longitudinal wave type ultrasonic waves generated by the ultrasonic generation modules 500, whereby no sound may be heard in regions other than the region in which the user is located, and therefore a user privacy protection function may be realized. Furthermore, in the display apparatus 30 according to the third embodiment of the present disclosure, contaminants may be removed from the surface of the display panel 110 by plate wave type ultrasonic waves generated on the display panel 110 due to longitudinal wave type ultrasonic waves, whereby a self-cleaning function may be realized.

Figure 10:
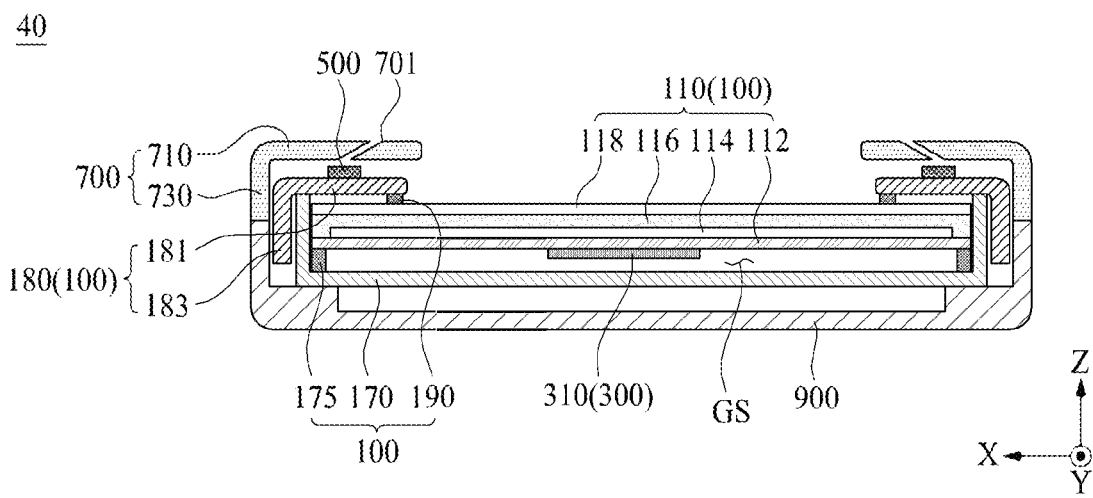
FIG. 10 is a diagram schematically illustrating a display apparatus according to a fourth embodiment of the present disclosure.

FIG. 10 is a diagram schematically illustrating a display apparatus according to a fourth embodiment of the present disclosure. In this embodiment, the sound generation components of the display apparatus shown in FIG. 9 are modified. Hereinafter, a duplicate description of components identical to or corresponding to the components shown in FIG. 9 will be omitted or given briefly.

With reference to FIG. 10, a display apparatus 40 according to a fourth embodiment of the present disclosure may include a display module 100, a sound generation module 300, a plurality of ultrasonic generation modules 500, and a front cover 700.

The display module 100 may be a self-emitting display module, such as an organic light emitting display module, a quantum dot light emitting display module, a micro light emitting diode display module, or any other type of display module that outputs light.

The display module 100 according to an embodiment may include a display panel 110, a support cover 170, and a front case 180.

The display panel 110 may be a light emitting display panel. The display panel 110 according to an embodiment may include a pixel array substrate 112 having a pixel array 114 including a plurality of pixels, an encapsulation layer 116 for encapsulating the pixel array 114, and an optical film 118 attached to the upper surface of the encapsulation layer 116. The display panel 110 is identical to the display panel shown in FIG. 7, and therefore a duplicate description thereof will be omitted.

The support cover 170 may support the display panel 110 by a panel-coupling member 175, and may surround the rear surface and the side surfaces of the display panel 110. The support cover 170 according to an embodiment may be made of a metal material, such as aluminum or an aluminum alloy.

The panel-coupling member 175 may be interposed between the display panel 110 and the support cover 170 in order to provide a gap space GS between the display panel 110 and the support cover 170. For example, the gap space GS may be expressed as an air gap, a vibration space, or a sound box, but is not limited thereto. The panel-coupling member 175 may be disposed at the rear edge (or periphery) of the display panel 110 and at the front edge (or periphery) of the support cover 170 in order to adhere the display panel 110 and the support cover 170 to each other. For example, the panel-coupling member 175 may be realized as a double-sided adhesive tape, a single-sided adhesive tape, or a double-sided adhesive foam pad, but is not limited thereto.

The front case 180 may cover the front edge (or periphery) of the display panel 110, and may support the ultrasonic generation modules 500. The front case 180 covers a non-display area of the display panel 110, rather than a display area thereof, in order to hide the remaining portion of the display module 100, excluding the display area of the display panel 110. The front case 180 may be used as a vibration plate of each of the ultrasonic generation modules 500.

The sound generation module 300 is disposed at the rear surface of the display panel 110, and directly vibrates the display panel 110 in order to generate a sound. The sound generation module 300 according to an embodiment may include at least one vibration device 310 attached to the rear surface of the display panel 110. The at least one vibration device 310 is identical to the ultrasonic generation module shown in FIG. 4 or the sound generation module shown in FIG. 5, and therefore a duplicate description thereof will be omitted.

The ultrasonic generation modules 500 and the front cover 700 are substantially identical to the ultrasonic generation modules and the front cover shown in FIGS. 9 and 10, respectively, and therefore a duplicate description thereof will be omitted.

In the display apparatus 40 according to the fourth embodiment of the present disclosure, a sound generated from the display panel 110 vibrated according to the vibration of the sound generation module 300 disposed at the rear surface of the display panel 110 may be output to the front of the display panel 110, whereby a viewer's immersion experience may be enhanced due to harmony (or matching) between an image and the sound. Also, in the display apparatus 40 according to the fourth embodiment of the present disclosure, a sound generated from the display panel 110 vibrated according to the vibration of the sound generation module 300 may be concentrated only on a user located in front of the display panel 110 using the directivity of longitudinal wave type ultrasonic waves generated by the ultrasonic generation modules 500, whereby no sound may be heard in regions other than the region in which the user is located, and therefore a user privacy protection function may be realized. Furthermore, in the display apparatus 40 according to the fourth embodiment of the present disclosure, contaminants may be removed from the surface of the display panel 110 by plate wave type ultrasonic waves generated on the display panel 110 due to longitudinal wave type ultrasonic waves, whereby a self-cleaning function may be realized.

Figure 11:
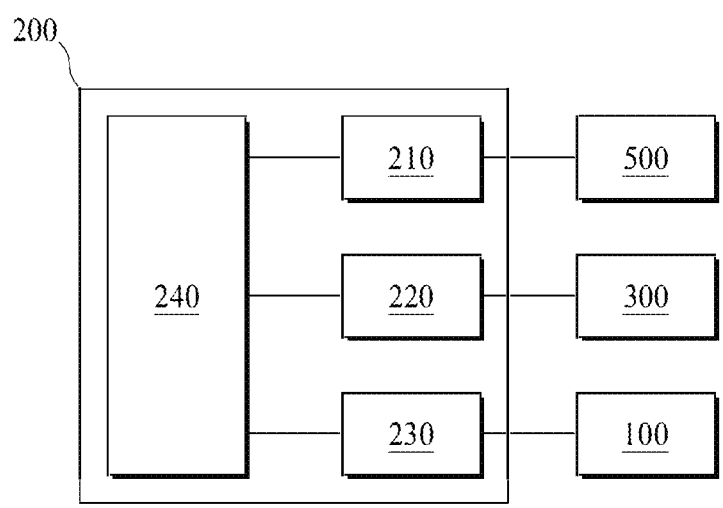
FIG. 11 is a circuit diagram illustrating a driving circuit unit according to an embodiment of the present disclosure.

FIG. 11 is a circuit diagram illustrating a driving circuit unit according to an embodiment of the present disclosure.

With reference to FIG. 11, a driving circuit unit 200 according to an embodiment of the present disclosure may include a sound driving circuit 210, an ultrasonic driving circuit 220, a video processing circuit 230, and a central control circuit 240.

The sound driving circuit 210 may be electrically connected to the sound generation module 300. The sound driving circuit 210 may generate a sound signal from digital sound data under the control of the central control circuit 240, may amplify the sound signal in order to generate a sound driving signal, and may provide the generated sound driving signal to the sound generation module 300. The sound generation module 300 may be vibrated according to the sound driving signal received from the sound driving circuit 210, and may vibrate the display module 100 or the display panel in order to generate a sound.

The ultrasonic driving circuit 220 may be electrically connected to each of the ultrasonic generation modules 500. The ultrasonic driving circuit 220, the driving of which is synchronous with the driving of the sound driving circuit 210, may generate an ultrasonic driving signal under the control of the central control circuit 240, and may provide the generated ultrasonic driving signal to each of the ultrasonic generation modules 500. Each of the ultrasonic generation modules 500 is vibrated according to the ultrasonic driving signal received from the ultrasonic driving circuit 220 in order to generate longitudinal wave type ultrasonic waves.

The video processing circuit 230 generates video data and a timing synchronization signal from an image source, and provides the generated video data and the generated timing synchronization signal to a panel driving circuit of the display module 100. The panel driving circuit may receive the video data and the timing synchronization signal from the video processing circuit 230, and may display an image corresponding to the video data on the display panel according to the timing synchronization signal.

The central control circuit 240 may control the operation of the sound driving circuit 210, the ultrasonic driving circuit 220, and the video processing circuit 230.

The central control circuit 240 according to an embodiment may sense user manipulation or power off in order to control the driving of the ultrasonic driving circuit 220. In one embodiment, the central control circuit 240 may generate a panel-cleaning control signal in response to user manipulation of a separate panel-cleaning button provided at the display apparatus, and may provide the generated panel-cleaning control signal to the ultrasonic driving circuit 220. In another embodiment, when the display apparatus is turned off, the central control circuit 240 may generate a panel-cleaning control signal, and may provide the generated panel-cleaning control signal to the ultrasonic driving circuit 220. In a further embodiment, in the case in which the non-driving time of the sound driving circuit 210 exceeds a predetermined reference time, the central control circuit 240 may generate a panel-cleaning control signal, and may provide the generated panel-cleaning control signal to the ultrasonic driving circuit 220. The panel-cleaning control signal may be generated independently, rather than being synchronous with the driving of the sound driving circuit 210.

The ultrasonic driving circuit 220 may generate an ultrasonic driving signal in response to the panel-cleaning control signal from the central control circuit 240, and may provide the generated ultrasonic driving signal to each of the ultrasonic generation modules 500. For example, each of the ultrasonic generation modules 500 may be vibrated according to the ultrasonic driving signal received from the ultrasonic driving circuit 220 in order to generate longitudinal wave type ultrasonic waves, and contaminants may be removed from the surface of the display panel 110 by plate wave type ultrasonic waves generated on the surface of the display panel due to the longitudinal wave type ultrasonic waves.

Additionally, the central control circuit 240 may generate a panel-cleaning guidance signal, which is synchronous with the panel-cleaning control signal, and may provide the generated panel-cleaning guidance signal to the sound driving circuit 210. For example, the sound driving circuit 210 may amplify the panel-cleaning guidance signal received from the central control circuit 240 in order to generate a sound driving signal, and may provide the generated sound driving signal to the sound generation module 300. The sound generation module 300 may be vibrated according to the sound driving signal from the sound driving circuit 210, and may vibrate the display module 100 or the display panel in order to generate a panel-cleaning guidance sound, from which a user may be informed that a self-cleaning function is being performed.

Figure 12:
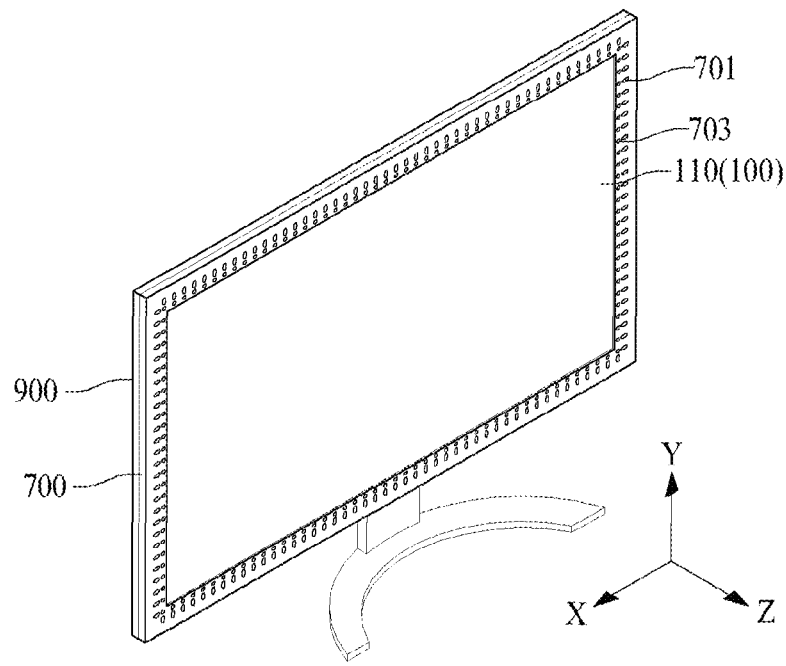
FIG. 12 is a diagram illustrating a monitor using a display apparatus according to an embodiment of the present disclosure.

Each of the display apparatuses according to the first to fourth embodiments of the present disclosure may be used as a monitor illustrated in FIG. 12, and may also be used as televisions (TVs), navigation devices, electronic pads, or a tablet computers. In the display apparatus according to the present disclosure illustrated in FIG. 12, a sound may be output to the front of the display panel 110, whereby a viewer's immersion experience may be enhanced due to harmony (or matching) between an image and the sound. In addition, the sound may be concentrated only on a user located in front of the display panel 110 using longitudinal wave type ultrasonic waves, whereby a user privacy protection function may be realized. Furthermore, contaminants may be removed from the surface of the display panel 110 by plate wave type ultrasonic waves generated on the display panel 110 due to the longitudinal wave type ultrasonic waves, whereby a self-cleaning function may be realized.

Figure 13:
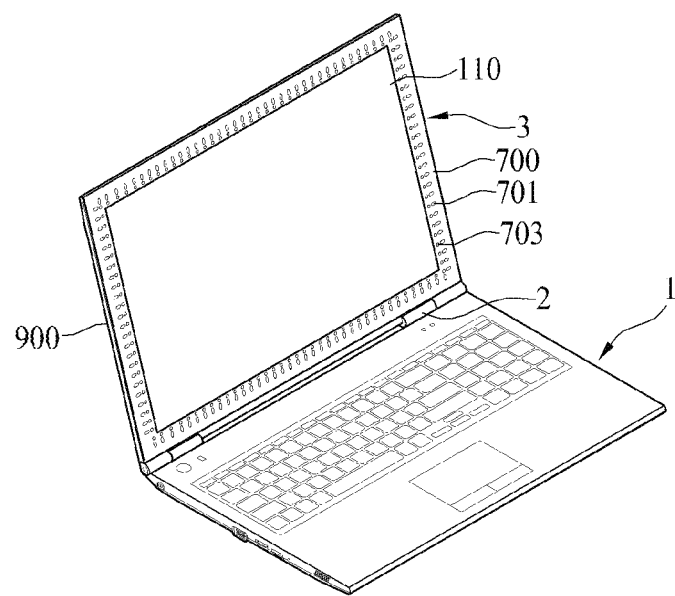
FIG. 13 is a diagram illustrating a computing apparatus according to an embodiment of the present disclosure.

FIG. 13 is a diagram illustrating a computing apparatus according to an embodiment of the present disclosure.

With reference to FIG. 13, a computing apparatus according to an embodiment of the present disclosure may include a system main body 1, a hinge part 2, and a display apparatus 3 rotatably coupled or connected to the system main body 1 via the hinge part 2.

The system main body 1 may include a main board, various circuits mounted on the main board, various storage media, a peripheral device, a keyboard, and a power supply device, etc. The various circuits mounted on the main board may include a central control circuit for processing various information, an image processing circuit for processing data according to control by the central control circuit, and a sound processing circuit for processing a sound according to control by the central control circuit, etc. The system main body 1 may process various information, may generate video data, a sound driving signal, and an ultrasonic driving signal, and may provide the generated video data, the generated sound driving signal, and the generated ultrasonic driving signal to the display apparatus 3.

The hinge part 2 may be mounted (or installed) between the system main body 1 and the display apparatus 3, and may rotatably support a lower side of the display apparatus 3.

The display apparatus 3 may be rotatably mounted (or installed) to the hinge part 2, may cover the upper surface of the system main body 1, or may be unfolded by a particular angle from the top of the system body 1 with the hinge part 20 as a rotation shaft.

The display apparatus 3 may display an image corresponding to video data received from the system main body 1 according to a timing control signal received from the system main body 1, and may output a sound and longitudinal wave type ultrasonic waves corresponding to a sound driving signal received from the system main body 1. Here, the sound driving signal may or may not be synchronous with an image signal. The display apparatus 3 is substantially identical in construction to one of the display apparatuses 10, 20, 30, and 40 according to the first to fourth embodiments of the present disclosure shown in FIGS. 1 to 10, and therefore a duplicate description thereof will be omitted.

Figure 14:
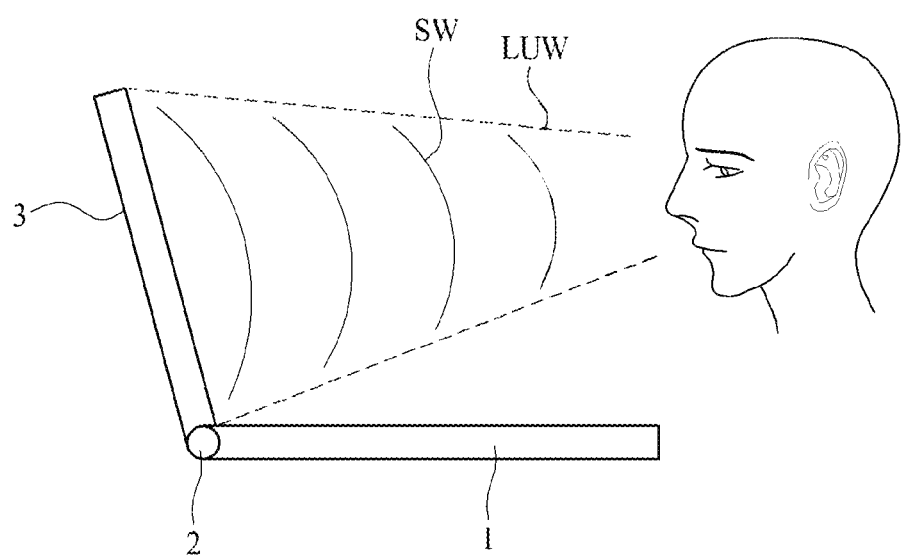
FIG. 14 is a diagram illustrating a sound concentrated on a viewer due to plate wave type ultrasonic waves.

In the computing apparatus according to the embodiment of the present disclosure, as illustrated in FIG. 14, a sound SW may be output to the front of the display apparatus 3, whereby a viewer's immersion experience may be enhanced due to harmony (or match) between an image and the sound SW. In addition, the sound SW may be concentrated only on a user located in front of the display apparatus 3 using longitudinal wave type ultrasonic waves LUW, whereby a user privacy protection function may be realized. Furthermore, in the computing apparatus according to the embodiment of the present disclosure, contaminants may be removed from the surface of the display panel by plate wave type ultrasonic waves LUW generated on the display panel due to the longitudinal wave type ultrasonic waves LUW, whereby a self-cleaning function may be realized.

A display apparatus and a computing apparatus using the same according to the present disclosure will be described below.

A display apparatus according to an embodiment of the present disclosure includes a display module having a display panel configured to display an image, a sound generation module disposed at the display module and configured to vibrate the display module to generate sound, a first cover configured to cover a first periphery portion of the display module, and a plurality of ultrasonic generation modules disposed between the first periphery portion of the display module and the first cover. The first cover includes a plurality of first holes overlapping with the plurality of ultrasonic generation modules.

According to some embodiments of the present disclosure, the first cover further includes a first cover part configured to cover the plurality of ultrasonic generation modules, and a second cover part connected to the first cover part to cover side surfaces of the display module. The plurality of first holes obliquely penetrates the first cover part.

According to some embodiments of the present disclosure, each of the first holes includes a first side exposed to a front surface of the first cover part, a second side exposed to a rear surface of the first cover part, and an inclined surface between the first side and the second side. A shortest distance between the second cover part and the first side is greater than a shortest distance between the second cover part and the second side.

According to some embodiments of the present disclosure, an angle between the inclined surface of each of the first holes and the rear surface of the first cover part is an acute angle.

According to some embodiments of the present disclosure, the angle between the inclined surface of each of the first holes and the rear surface of the first cover part is 15 to 30 degrees.

According to some embodiments of the present disclosure, the display module includes a front case covering a first periphery portion of the display panel and supporting the sound generation module. The plurality of ultrasonic generation modules are disposed on the front case, and the sound generation module includes a plurality of vibration devices disposed on the front case in parallel to the plurality of ultrasonic generation modules and configured to vibrate the front case to generate sound.

According to some embodiments of the present disclosure, the display module includes a front case covering a first periphery portion of the display panel and supporting the sound generation module. The plurality of ultrasonic generation modules are disposed on the front case, and the sound generation module is attached to the front case, the sound generation module being adjacent to the plurality of ultrasonic generation modules.

According to some embodiments of the present disclosure, each of the plurality of vibration devices includes a piezoelectric device.

According to some embodiments of the present disclosure, the first cover further includes a plurality of second holes overlapping with the plurality of vibration devices.

According to some embodiments of the present disclosure, the sound generation module includes a vibration device disposed at a rear surface of the display panel, and the vibration device is configured to directly vibrate the display panel to generate sound.

According to some embodiments of the present disclosure, the display module further includes a guide frame configured to support the display panel, a backlight unit disposed at a rear surface of the display panel, a second cover having an opening overlapping with a remaining portion of the backlight unit, excluding a second periphery portion of the backlight unit, the second cover being configured to support the second periphery portion of the backlight unit and the guide frame, and a vibration plate covering the opening of the second cover and supporting the sound generation module. The display panel vibrates according to vibration of the vibration plate by the sound generation module and outputs sound.

According to some embodiments of the present disclosure, each of the plurality of ultrasonic generation modules generates longitudinal wave type ultrasonic waves having a frequency of 20 kHz to 40 kHz.

According to some embodiments of the present disclosure, the display apparatus further includes a driving circuit configured to sense user manipulation or power off to generate a panel-cleaning control signal, and to vibrate each of the plurality of ultrasonic generation modules according to the panel-cleaning control signal.

According to some embodiments of the present disclosure, the sound generation module includes a piezoelectric composite layer, and the piezoelectric composite layer includes a plurality of piezoelectric parts and a plurality of flexible parts respectively connected between the plurality of piezoelectric parts.

According to some embodiments of the present disclosure, each of the plurality of ultrasonic generation modules includes a piezoelectric body.

According to some embodiments of the present disclosure, a width of the piezoelectric body is greater than a thickness of the piezoelectric body.

According to some embodiments of the present disclosure, a length of the piezoelectric body is greater than four or more times the width of the piezoelectric body.

A computing apparatus according to an embodiment of the present disclosure includes a system main body and a display apparatus including a display module having a display panel configured to display an image, a sound generation module disposed at the display module and configured to vibrate the display module to generate sound, a first cover configured to cover a first periphery portion of the display module, and a plurality of ultrasonic generation modules disposed between the first periphery portion of the display module and the first cover. The first cover includes a plurality of first holes overlapping with the plurality of ultrasonic generation modules. The computing apparatus further includes a hinge part mounted between the system main body and the display apparatus and configured to rotatably support the display apparatus.

According to some embodiments of the present disclosure, each of the plurality of ultrasonic generation modules includes a piezoelectric body.

According to some embodiments of the present disclosure, a width of the piezoelectric body is greater than a thickness of the piezoelectric body, and a length of the piezoelectric body is greater than four or more times the width of the piezoelectric body.

A display apparatus according to an embodiment of the present disclosure includes a display panel configured to display an image, a sound generation module configured to directly vibrate the display panel to generate sound, a front case configured to cover a first periphery portion of the display panel, a plurality of ultrasonic generation modules disposed at the front case, and a first cover covering the plurality of ultrasonic generation modules and including a plurality of holes overlapping with the plurality of ultrasonic generation modules. The plurality of holes obliquely penetrates the first cover.

According to some embodiments of the present disclosure, each of the plurality of holes includes a first side exposed to a front surface of the first cover, a second side exposed to a rear surface of the first cover, and an inclined surface between the first side and the second side. An angle between the rear surface of the first cover and the inclined surface is an acute angle.

According to some embodiments of the present disclosure, the angle between the rear surface of the first cover and the inclined surface is 15 to 30 degrees.

According to some embodiments of the present disclosure, the sound generation module includes a piezoelectric composite layer, and the piezoelectric composite layer includes a plurality of piezoelectric parts and a plurality of flexible parts respectively connected between the plurality of piezoelectric parts.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Thus, the scope of the present disclosure is defined by the appended claims, and it is intended that all variations or modifications derived from the meaning, scope, and equivalent concept of the claims includes within the scope of the present disclosure.

What is claimed is:

1. A display apparatus, comprising:
    a display module having a display panel configured to display an image;
    a sound generation module disposed at the display module and configured to vibrate the display module to generate sound;
    a first cover configured to cover a first periphery portion of the display module; and
    a plurality of ultrasonic generation modules disposed between the first periphery portion of the display module and the first cover,
    wherein the first cover includes a plurality of first holes overlapping with the plurality of ultrasonic generation modules.

2. The display apparatus according to claim 1, wherein the first cover further comprises:
    a first cover part configured to cover the plurality of ultrasonic generation modules; and
    a second cover part connected to the first cover part to cover side surfaces of the display module,
    wherein the plurality of first holes obliquely penetrates the first cover part.

3. The display apparatus according to claim 2, wherein each of the first holes comprises:
    a first side exposed to a front surface of the first cover part;
    a second side exposed to a rear surface of the first cover part; and
    an inclined surface between the first side and the second side,
    wherein a shortest distance between the second cover part and the first side is greater than a shortest distance between the second cover part and the second side.

4. The display apparatus according to claim 3, wherein an angle between the inclined surface of each of the first holes and the rear surface of the first cover part is an acute angle.

5. The display apparatus according to claim 3, wherein an angle between the inclined surface of each of the first holes and the rear surface of the first cover part is 15 to 30 degrees.

6. The display apparatus according to claim 1, wherein:
    the display module includes a front case covering a first periphery portion of the display panel and supporting the sound generation module;
    the plurality of ultrasonic generation modules are disposed on the front case; and
    the sound generation module includes a plurality of vibration devices disposed on the front case in parallel to the plurality of ultrasonic generation modules and configured to vibrate the front case to generate sound.

7. The display apparatus according to claim 1, wherein:
    the display module includes a front case covering a first periphery portion of the display panel and supporting the sound generation module;
    the plurality of ultrasonic generation modules are disposed on the front case; and
    the sound generation module is attached to the front case, the sound generation module being adjacent to the plurality of ultrasonic generation modules.

8. The display apparatus according to claim 6, wherein each of the plurality of vibration devices includes a piezoelectric device.

9. The display apparatus according to claim 6, wherein the first cover further includes a plurality of second holes overlapping with the plurality of vibration devices.

10. The display apparatus according to claim 1, wherein the sound generation module includes a vibration device disposed at a rear surface of the display panel, and the vibration device is configured to directly vibrate the display panel to generate sound.

11. The display apparatus according to claim 10, wherein the display module further comprises:
    a guide frame configured to support the display panel;
    a backlight unit disposed at a rear surface of the display panel;
    a second cover having an opening overlapping with a remaining portion of the backlight unit, excluding a second periphery portion of the backlight unit, the second cover being configured to support the second periphery portion of the backlight unit and the guide frame; and
    a vibration plate covering the opening of the second cover and supporting the sound generation module, wherein the display panel vibrates according to vibration of the vibration plate by the sound generation module and outputs sound.

12. The display apparatus according to claim 1, wherein each of the plurality of ultrasonic generation modules generates longitudinal wave type ultrasonic waves having a frequency of 20 kHz to 40 kHz.

13. The display apparatus according to claim 1, further comprising:
a driving circuit configured to sense user manipulation or power off to generate a panel-cleaning control signal, and to vibrate each of the plurality of ultrasonic generation modules according to the panel-cleaning control signal.

14. The display apparatus according to claim 1, wherein:
the sound generation module includes a piezoelectric composite layer; and
the piezoelectric composite layer includes:
a plurality of piezoelectric parts; and
a plurality of flexible parts respectively connected between the plurality of piezoelectric parts.

15. The display apparatus according to claim 1, wherein each of the plurality of ultrasonic generation modules includes a piezoelectric body.

16. The display apparatus according to claim 15, wherein:
a width of the piezoelectric body is greater than a thickness of the piezoelectric body.

17. The display apparatus according to claim 16, wherein:
a length of the piezoelectric body is greater than four or more times the width of the piezoelectric body.

18. A computing apparatus, comprising:
a system main body;
the display apparatus according to claim 1; and
a hinge part mounted between the system main body and the display apparatus and configured to rotatably support the display apparatus.

19. The computing apparatus according to claim 18, wherein each of the plurality of ultrasonic generation modules includes a piezoelectric body.

20. The computing apparatus according to claim 19, wherein
a width of the piezoelectric body is greater than a thickness of the piezoelectric body, and
a length of the piezoelectric body is greater than four or more times the width of the piezoelectric body.

21. A display apparatus, comprising:
a display panel configured to display an image;
a sound generation module configured to directly vibrate the display panel to generate sound;
a front case configured to cover a first periphery portion of the display panel;
a plurality of ultrasonic generation modules disposed at the front case; and
a first cover covering the plurality of ultrasonic generation modules and including a plurality of holes overlapping with the plurality of ultrasonic generation modules,
wherein the plurality of holes obliquely penetrates the first cover.

22. The display apparatus according to claim 21, wherein each of the plurality of holes comprises:
a first side exposed to a front surface of the first cover;
a second side exposed to a rear surface of the first cover; and
an inclined surface between the first side and the second side,
wherein an angle between the rear surface of the first cover and the inclined surface is an acute angle.

23. The display apparatus according to claim 22, wherein the angle between the rear surface of the first cover and the inclined surface is 15 to 30 degrees.

24. The display apparatus according to claim 21, wherein:
the sound generation module includes a piezoelectric composite layer; and
the piezoelectric composite layer includes:
a plurality of piezoelectric parts; and
a plurality of flexible parts respectively connected between the plurality of piezoelectric parts.

* * * * *